Figure 1:
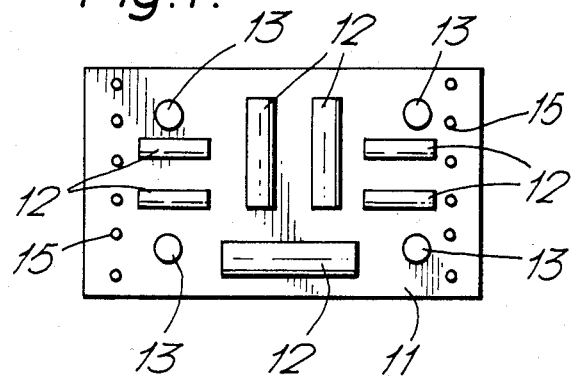

United States Patent [19]

Pearce

[11] Patent Number: 4,542,260
[45] Date of Patent: Sep. 17, 1985

[54] ENCAPSULATED ASSEMBLIES
[75] Inventor: David W. Pearce, Avon, England
[73] Assignee: GEC Avionics Limited, England
[21] Appl. No.: 646,905
[22] Filed: Aug. 31, 1984
[30] Foreign Application Priority Data
  Sep. 5, 1983 [GB] United Kingdom ............... 8323755
[51] Int. Cl.$^4$ ............................................. H05K 5/00
[52] U.S. Cl. ........................ 174/52 PE; 264/272.17; 361/395; 361/399
[58] Field of Search .............. 174/52 PE; 264/272.11, 264/272.13, 272.14, 272.15, 272.17, 275; 361/395, 399

[56] References Cited
U.S. PATENT DOCUMENTS
3,778,685 12/1973 Kennedy ................... 174/52 PE X
4,066,839 1/1978 Cossutta et al. ................ 174/52 PE Primary Examiner—A. T. Grimley
Assistant Examiner—D. A. Tone
Attorney, Agent, or Firm—Kirchstein, Kirchstein, Ottinger & Israel

[57] ABSTRACT

An encapsulated assembly of electric components (12) on a board (11) wherein the board and components are encapsulated in a mass of silicone rubber (17) which rubber mass is in turn encapsulated in a mass of rigid epoxy resin compound (21) which is partially supported by pillars (13) which are mounted on the board and extend outwardly to the surface of the mass of foamed silicone rubber, electrical connection to the components being provided by connector pins (15) extending through both encapsulations.

6 Claims, 6 Drawing Figures

ENCAPSULATED ASSEMBLIES

This invention relates to encapsulated assemblies.

More particularly the invention relates to encapsulated assemblies of electric components carried on a board, for example, a printed circuit board.

It is an object of the present invention to provide such an encapsulated assembly which is capable of withstanding external hydrostatic pressures such as are encountered in a sub-sea environment.

According to the invention there is provided an encapsulated assembly comprising: a plurality of electric components carried on a board: support pillars mounted on and projecting outwardly from at least one of the major surfaces of the board; connector pins for the components extending outwardly from the board; a mass of foamed silicone rubber encapsulating the board and components so that the outer ends of the support pillars are substantially flush with the surface of the mass and the ends of the connector pins extend outwardly beyond the surface of the mass; and a mass of substantially rigid epoxy resin compound encapsulating said foamed rubber mass from which resin compound mass the outer ends of the connector pins only project.

In a preferred arrangement in accordance with the invention the mass of epoxy resin compound is secured to a mounting chassis by means of adhesive.

The mounting chassis suitably supports electrical connector means which is electrically connected with the projecting ends of the connector pins by wiring connections.

In such an arrangement said mass of epoxy resin compound, mounting chassis, and wiring connections are suitably together encapsulated in a further mass of substantially rigid epoxy resin compound from which the connector means only projects.

Figure 2:
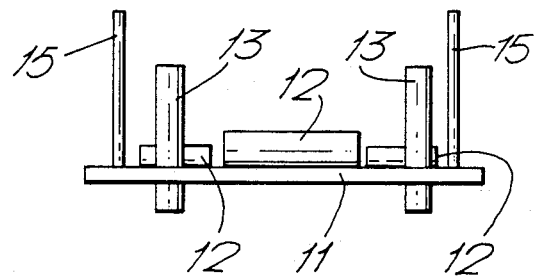
Figure 3:
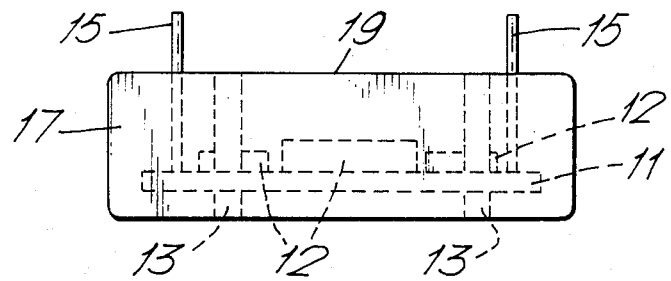
Figure 4:
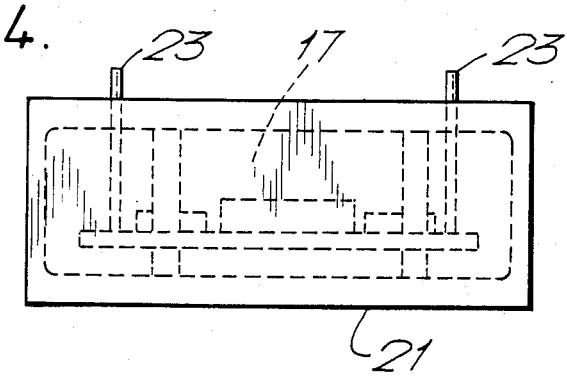
Figure 5:
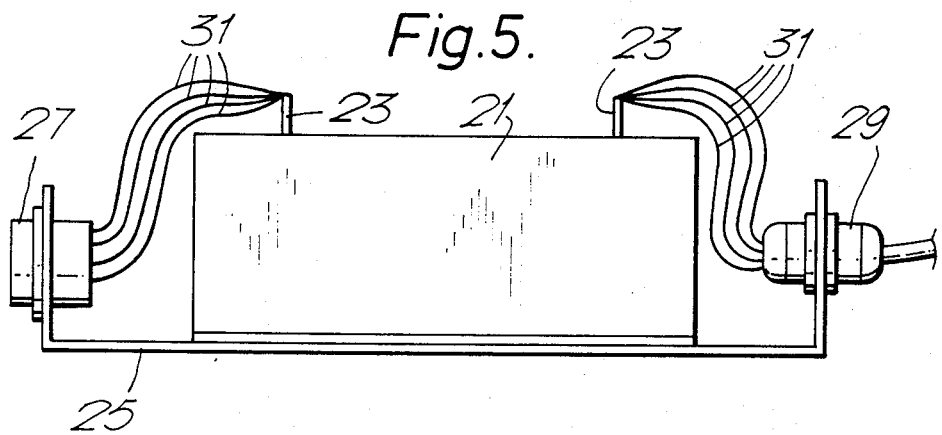
Figure 6:
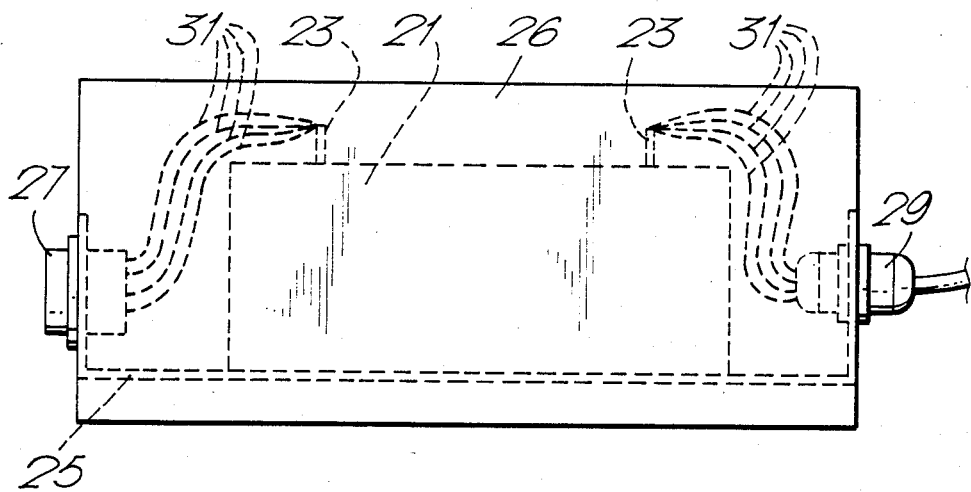

One encapsulated assembly in accordance with the invention and its manufacture will now be described by way of example with reference to the accompanying drawings in which:

FIG. 1 shows, diagrammatically, a plan view of the assembly at a first stage in its manufacture, FIG. 2 is a side elevation of the assembly at the same stage as in FIG. 1, FIG. 3 depicts a first encapsulation stage in the manufacture, FIG. 4 shows, diagrammatically, a second encapsulation stage in the manufacture, FIG. 5 shows, diagrammatically, a further stage in the manufacture, and FIG. 6 shows, diagrammatically, a third encapsulation stage in the manufacture.

Referring to FIG. 1, the assembly includes a printed circuit board 11 carrying electric components 12 on one side. The board 11 is provided with support pillars 13 and connector pins 15 extending perpendicular to the major surfaces of the board. Four pillars 13 are provided, one towards each corner of the boards 11, each pillar 13 being secured to the board 11 and extending on both sides of the board 11 to a greater length on the side of the board on which the components 12 are carried.

The connector pins 15 extend from the board 11 in two lines, one adjacent each shorter side of the board 11, on that side only of the board 11 on which the pillars 13 are longer, and project appreciably beyond the pillars.

The board and component assembly is first encapsulated in foamed silicone rubber 17 (FIG. 3) in such a way that the outer ends of the support pillars 13 are just flush with the surface 19 of the rubber 17 and the end portions of the connector pins 15 project beyond the surface 19.

A second stage encapsulation involving a mass of a rigid epoxy resin compound 21 is then carried out (FIG. 4). This creates a rectangularly-shaped object from which only the tips 23 of the electrical connector pins 15 project.

At this stage the encapsulated assembly is attached, by means of adhesive, to a mounting chassis 25 which also supports electrical connector means 27 and 29, the connection means 27 being one part of a two-part connector and the connector means 29 being a penetrator. (FIG. 5). Wiring connections 31 are made between the connector 27 and the penetrator 29 and the tips 23 of the pins 15 projecting from the encapsulation 21, and the assembly is then encapsulated in a further mass of rigid epoxy resin compound 26 (FIG. 6) from which only the connector 27 and the penetrator 29 project externally. The two epoxy resin compound encapsulations 21 and 26 together form a pressure isolating enclosure for which additional support is provided internally by the pillars 13 attached to the board 11. Pressure stresses are not transmitted to the electrical components 12 on the board 11 because the foamed silicone rubber 17 acts as a resilient, pressure isolating medium.

It will be appreciated that while in the particular embodiment of the invention described above by way of example the support pillars extend from both major surfaces of the board, in other embodiments of the invention the support pillars may extend from one major surface only. In this case the other major surface of the board will be arranged to be flush with or close to the surface of the silicone rubber mass.

We claim:

1. An encapsulated assembly comprising electric components on a board; support pillars mounted on and projecting outwardly from at least one of the major surfaces of the board; connector pins for the components extending outwardly from the board; a mass of foamed silicone rubber encapsulating the board and components so that the outer ends of the support pillars are substantially flush with the surface of the mass and the ends of the connector pins extend outwardly beyond the surface of the mass; and a mass of substantially rigid epoxy resin compound encapsulating said foamed rubber mass from which resin compound mass the outer ends of the connector pins only project.

2. An encapsulated assembly according to claim 1 wherein said mass of epoxy resin compound is secured to a mounting chassis by means of adhesive.

3. An encapsulated assembly according to claim 2 wherein said chassis supports electrical connector means which is electrically connected with the projecting ends of the connector pins by wiring connections.

4. An encapsulated assembly according to claim 3 wherein said mass of epoxy resin compound, mounting chassis andd wiring connections are together encapsulated in a further mass of substantially rigid epoxy resin compound from which the connector means only projects.

5. An encapsulated assembly according to claim 1 wherein said support pillars project from both major surfaces of said board.

6. An encapsulated assembly according to claim 1 wherein said board is of rectangular form and there are four said support pillars, one positioned towards each corner of the board.

* * * * *